Sept. 24, 1963 L. T. MATZEK 3,105,203

HIGH-FREQUENCY AMPLIFIER WITH INPUT CIRCUIT STABILIZING MEANS

Filed Feb. 26, 1959

INVENTOR
Lester T. Matzek
BY James J. Jennings, Jr.
ATTORNEY 3,105,203

HIGH-FREQUENCY AMPLIFIER WITH INPUT CIRCUIT STABILIZING MEANS

Lester T. Matzek, Lombard, Ill., assignor to Zenith Radio Corporation, a corporation of Delaware Filed Feb. 26, 1959, Ser. No. 795,667
5 Claims. (Cl. 330—130)

Figures 1, 2:
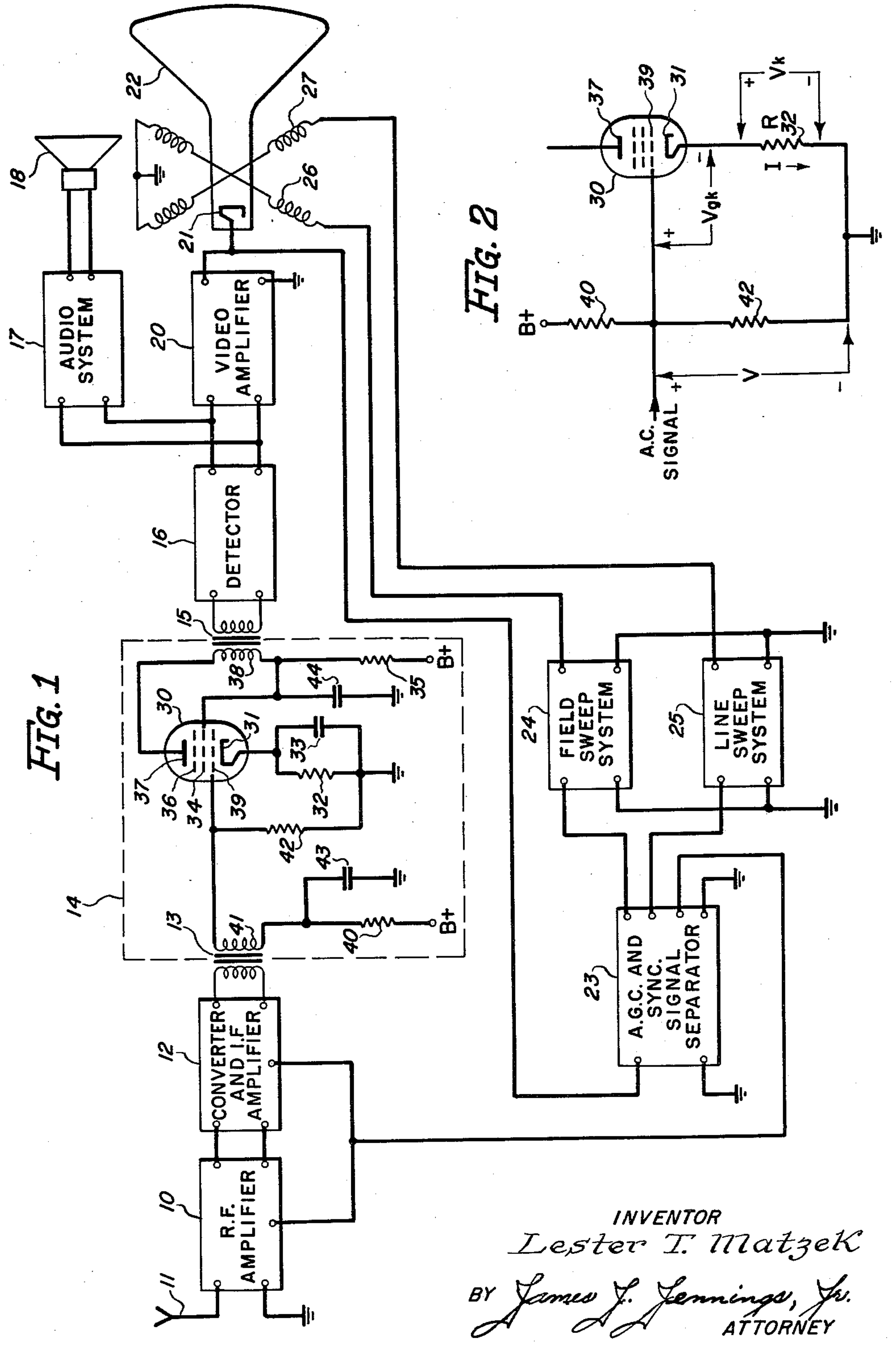

This invention is directed to a high-frequency amplifier circuit and more particularly to a sharply-tuned amplifier circuit wherein variations of the input capacitance of the amplifier device are compensated to prevent detuning.

Many wave-signal receivers include high-frequency amplifier stages tuned to a predetermined resonant frequency; after alignment at a particular frequency, it is requisite for optimum operation that the signal channel remain tuned to this frequency. Such an amplifier circuit is a sharply-tuned intermediate-frequency amplifier stage of a television receiver. The electronics art now recognizes that the tuning between stages of such a channel is a function of, among other things, the "dynamic" input capacitance of the electron-discharge amplifier device, where a resonant circuit such as the tuned secondary circuit of a coupling transformer is coupled to the input or control grid. "Dynamic" input capacitance as used herein indicates the tube's actual input capacitance under operating conditions; specifically, this term describes not the physical capacity measured from control grid to cathode of a cold tube, but the actual input capacitance under operating conditions when a space charge or cloud of electrons is positioned between grid and cathode.

The dynamic input capacitance of a tube is a function of the location of the space charge or cloud of electrons disposed between control grid and cathode. Any displacement of this space charge necessarily varies the dynamic input capacitance, thereby detuning the tuned circuit connected to the control grid. One of the factors which effects a variation in space charge location is the variation of cathode emissivity which normally occurs as the tube ages. Specifically, decreased emission, which may occur after several hundred hours of operation, in effect moves the space charge toward the cathode; increased emissivity, which frequently occurs toward the end of tube life, displaces the space charge location nearer the control grid. Without any compensation for these deleterious effects the attendant detuning of the tuned circuit coupled to the control grid frequently reduces the effective gain of the I-F channel below an acceptable level.

It is therefore an object of the present invention to provide a compensated electron-discharge amplifier circuit wherein the space charge of electrons is stabilized, and consequently the dynamic input capacitance of the tube is maintained at a constant level, irrespective of variations in other parameters.

It is another object of the invention to provide such a compensated circuit wherein the amplifier is operated at a high gain.

A further object of the invention is the provision of such a high gain compensated amplifier by simple and economical circuitry.

A high-frequency amplifier circuit constructed in accordance with the invention comprises an electron-discharge device which has a cathode, a grid, and an anode; a first impedance element is coupled to the cathode. The output circuit direct-coupled path for the device includes the anode, the cathode, and the first impedance, and means are provided for applying a positive unidirectional operating potential to the anode to effect electron emission from the cathode and establish a space charge of electrons between grid and cathode. The circuit further comprises an input circuit direct-coupled path which includes in series connection the grid, cathode, first impedance, and a second impedance. Also included is a stabilizing network including means for applying to and maintaining on the grid a fixed unidirectional operating potential positive with respect to the end of the aforesaid first impedance remote from the cathode, the fixed unidirectional potential being of a value which stabilizes the position of the space charge between grid and cathode to reduce variations in dynamic input capacitance.

The features of this invention which are believed to be novel are set forth with particularity in the appended claims. The invention, together with further objects and advantages thereof, may best be understood, however, by reference to the following description taken in conjunction with the accompanying drawings, in the several figures of which like reference numerals identify like elements, and in which:

FIGURE 1 is a block diagram, partly in schematic form, of a television receiver which includes an embodiment of the invention; and FIGURE 2 is a partial schematic diagram useful in understanding the operation of the invention.

The television receiver circuit shown generally in FIGURE 1 is conventional in all respects except for the intermediate-frequency amplifier circuit, the details of which are explained hereinafter. It will be understood that each stage depicted as a single block may in fact comprise two or more signal-translating devices coupled in cascade. Briefly, a radio-frequency (R-F) amplifier 10 receives television signals from an antenna 11. R-F amplifier 10 is coupled through a converter and I-F amplifier 12 and transformer 13 to the circuit of the last intermediate-frequency amplifier stage 14. The output side of circuit 14 is coupled through a transformer 15 to a detector 16.

In the illustrated embodiment, the television receiver is of the intercarrier type; thus the video and sound signals are translated together from antenna 11 through detector 16. The output side of detector 16 is coupled through an audio system 17 to a loudspeaker 18 or other sound-reproducing device. The output side of detector 16 is also coupled through a video amplifier 20 to cathode 21 of an image-display device such as a cathode-ray tube 22. From video amplifier 20 another signal path leads to an automatic gain control (AGC) and synchronizing (sync) signal separator stage 23, which in turn is coupled to a field sweep system 24 and a line sweep system 25. The AGC voltage developed by stage 23 is applied to R-F amplifier 10 and to converter and I-F amplifier stages 12, to regulate the gain of these stages as a function of received signal strength in a well known manner. Field sweep system 24 and line sweep system 25 are coupled to respective deflection coils 26 and 27 associated with cathode-ray tube 22 to provide vertical and horizontal deflection of its electron beam; the terminals of coils 26 and 27 remote from systems 24 and 25 are connected to ground. Other conventional arrangements, which are neither requisite nor helpful for the illustration and understanding of the invention, have been omitted from the drawing.

In operation, a composite television signal received at antenna 11 is translated through R-F amplifier 10 and converted to an I-F signal and amplified in stages 12. The I-F signal is translated through transformer 13, last I-F amplifier 14 and transformer 15, and detected in detector 16. The resultant composite video signal is amplified in video amplifier 20 and applied to cathode 21 of image-display device 22, thus providing intensity modulation of its electron beam in a well known manner. An intercarrier sound system from detector 16 is translated to audio system 17 where it is demodulated, and the resultant audio-frequency output signal is amplified and applied to speaker 18.

In the sync signal separator portion of stage 23 the sync intelligence is separated from the composite video signal, and the horizontal and vertical sync signals are fed respectively to line sweep system 25 and field sweep system 24. Thus the deflection signals developed in these two systems are synchronized in a well known manner, such that the signals applied to deflection coils 26 and 27 serve to sweep the electron beam from cathode 21 over the face of image-display device 22 in the desired time relationship with the intensity modulation applied at cathode 21.

With respect to the structure of the novel intermediate-frequency amplifier circuit 14, this stage includes an electron-discharge device 30 which may be a conventional pentode tube. Cathode 31 of device 30 is coupled through an impedance element, shown as a resistor 32, to ground. A capacitor 33 is connected in shunt with resistor 32; this capacitor serves to bypass resistor 32 and thus prevents degenerative feedback at the frequencies which I-F amplifier 14 is designed to pass. Screen grid 34 is coupled through a dropping resistor 35 to a source of unidirectional operating potential, conventionally designated B+, and bypass capacitor 44 is connected between screen grid 34 and ground. The suppressor grid 36 is connected to ground. Anode 37 is coupled through primary winding 38 of transformer 15 and dropping resistor 35 to B+.

In accordance with the invention, means are provided for stabilizing the position of the space charge between grid and cathode to reduce variations in the dynamic input capacitance and consequent detuning of the tuned input circuit. In the illustrated embodiment, the stabilizing means include a voltage divider formed by a pair of impedances, preferably resistors 40 and 42. Resistor 40 is connected from B+ to the low-signal-potential terminal of secondary winding 41 of transformer 13, and resistor 42 is connected from the high-signal-potential terminal of winding 41 to ground. Secondary winding 41 has negligible D.-C. resistance and so may be disregarded in considering the voltage divider. Resistors 40 and 42 together form an effective voltage divider across which a positive unidirectional operating potential is applied; the divider has a tap, the common connection of the two resistors, which is connected to control grid 39 of tube 30. Accordingly a positive unidirectional operating potential is also applied to control grid 39. A bypass capacitor 43 is connected between ground and the junction of resistor 40 and secondary winding 41, to serve as a substantially zero-impedance return to ground for the intermediate-frequency signal and prevent substantial degeneration; accordingly, resistor 42 is also the damping resistor for secondary winding 41.

The operation of amplifier circuit 14 shown in FIGURE 1 may best be understood in connection with the equivalent circuit diagram of FIGURE 2. The stable D.-C. potential applied ffrom the common junction of resistors 40 and 42 to control grid 39 is designated V and is always a positive-polarity bias voltage. The potential difference appearing across cathode resistor R (or 32) is designated $Vk$; this potential difference is equal to the product of the current I flowing through resistor R times the value of this resistance. The resultant grid-cathode bias voltage is shown as $Vgk$ and, as apparent from FIGURE 2, is equal to $V-Vk$.

An input circuit path in amplifier stage 14 in which the elements are direct coupled so as to be capable of conducting direct current includes a series circuit comprising cathode resistor R, resistor 42, and the effective resistance between cathode 31 and control grid 39 internally of tube 30. Of course cathode resistor R is also in the direct-coupled output circuit of amplifier stage 14, as are anode 37 and cathode 31. For a given B+ potential a certain current flow I is established through cathode resistor R which in turn determines the voltage $Vk$. Thus, with the potential difference V determined by the voltage divider action of resistors 40 and 42, the grid-cathode bias voltage $Vgk$ is also determined; $Vgk=V-Vk$. Although $Vkg$ is shown as positive with respect to the cathode, it is apparent that if a sufficient voltage drop appears across resistor R, the resultant bias voltage ($Vgk$) will be negative with respect to the cathode. In operation, it is preferred that this resultant bias voltage be only slightly negative so that a substantial gain is obtained from amplifier stage 14 while the tuned input circuit is maintained free from drift. Manifestly the polarity and magnitude of $Vgk$ affect the location of the space charge between grid and cathode. If this voltage is strongly positive (relative to the cathode), the space charge is concentrated in a region near the control grid; conversely, when the bias voltage $Vgk$ is strongly negative, the space charge is concentrated in a region closer to the cathode.

It has been determined that many tubes suffer a decline of emissivity after an appreciable period of operation (e.g., 500 hours), and subsequently the emissivity increases even to a level surpassing the iniital emission. The problem engendered by a reduction of emissivity is first considered.

Transformer 13 may comprise tightly-coupled windings having sufficient distributed capacitance to tune the coupled circuits to resonate at the I-F frequency. When the space charge of electrons is established in a certain location, a certain value of dynamic input capacitance is determined; this value in turn contributes to a determination of the resonant frequency of the secondary circuit of transformer 13. With the decrease of cathode emission, the position of the space charge is displaced toward the cathode and diminished in size, thereby decreasing the dynamic input capacitance of the tube. The decrease in emission effects a decrease in current I flowing through resistor R, thus decreasing $Vk$. Because the potential V is maintained constant, any decrease in $Vk$ necessarily increases $Vgk$; that is, the grid goes more strongly positive with respect to cathode as the tube current decreases. This change in grid-cathode voltage $Vgk$ is in a direction to attract the space charge of electrons from the cathode toward the control grid, thus tending to maintain the space charge in its predetermined location irrespective of variations in cathode emissivity. Accordingly, the dynamic input capacitance of tube 30 remains substantially unchanged and the sharply tuned amplifier circuit is maintained in proper frequency adjustment to effect maximum gain at the intermediate frequency.

It is apparent that compensation for cathode emission variations in the opposite direction is also effected. If the emission of cathode 31 is increased toward the end of the tube's life and the space charge of electrons is thus displaced toward control grid 39, the increase in current I effects an increased drop across resistor R and therefore increases $Vk$, thereby decreasing $Vgk$. Thus the grid-cathode voltage undergoes a change in the negative direction which tends to force the space charge of electrons away from the control grid and back toward its original position with respect to the cathode; accordingly, the desired compensation is maintained for all changes in cathode activity.

The automatic compensation for variations of dynamic input capacitance is effected by the use of the voltage stabilizing network including resistors 40 and 42. When the voltage V in FIGURE 2 is maintained constant, it is possible to select the value of resistor 32 such that the tendency to alter the space charge location caused by variation in cathode voltage $Vk$ (in turn caused by a variation of cathode emissivity) is just sufficient to offset the opposing tendency to simultaneously effect a space charge position change in the opposite direction as a result of the concomitant variation in grid-cathode voltage $Vgk$. Without stabilizing the D.-C. potential of control grid 39, it would be necessary to employ a very large resistor between cathode 31 and ground to compensate for variations in the dynamic input capacitance or the position of the space charge of electrons; the resultant bias potential would substantially reduce the gain of the stage.

Because the invention in effect stabilizes the position of the space charge, and thus the dynamic input capacitance, it is not ordinarily desirable to utilize the inventive circuit in an amplifier stage to which an AGC signal is applied. To be effective, the AGC potential must itself alter the position of the space charge to regulate the gain of the tube. If any part of the AGC-caused variation of space charge position is compensated, the amount of gain regulation effected for a given change in input signal level is appreciably reduced.

It is therefore evident that the invention provides a compensated amplifier circuit wherein the position of the space charge of electrons between control grid and cathode is stabilized, thus maintaining the dynamic input capacity substantially constant and preventing undesirable detuning of the input signal circuit coupled to the control grid of the amplifier. The circuit is simple in operation, and both economical and facile in installation.

By way of illustration only and in no sense by way of limitation, I-F amplifier circuit 14 has been found to provide substantially complete stabilization of dynamic input capacitance when the following parameters are employed:

| | | |
|---|---|---|
| Tube 30 | | 6DK6 or 6BZ6 |
| Resistor 32 | ohms | 470 |
| Resistor 35 | do | 8.2K |
| Resistor 40 | do | 1M |
| Resistor 42 | do | 18K |
| Capacitor 33 | mmf | 470 |
| Capacitor 43 | do | 100 |
| Capacitor 44 | do | 330 |

While a particular embodiment of the present invention has been shown and described, it is apparent that changes and modifications may be made therein without departing from the invention in its broader aspects. The aim of the appended claims, therefore, is to cover all such changes and modifications as fall within the true spirit and scope of the invention.

I claim:

1. A high-frequency amplifier circuit comprising: an electron-discharge device having a cathode, a grid, and an anode; a first impedance coupled to said cathode; an output circuit direct-coupled path for said device including said anode, said cathode and said first impedance; means for applying a positive unidirectional operating potential to said anode for effecting electron emission from said cathode to establish a space charge of electrons between said grid and cathode; an input circuit direct-coupled path for said device including, in series connection, said grid, said cathode, said first impedance, and a second impedance; and a stabilizing network including means for applying to and maintaining on said grid a fixed unidirectional operating potential positive with respect to the end of said first impedance remote from said cathode, the fixed unidirectional potential being of a value which stabilizes the position of said space charge between said grid and cathode to reduce variations in dynamic input capacitance.

2. A high-frequency amplifier circuit comprising: an electron-discharge device having a cathode, a grid, and an anode; a first impedance coupled to said cathode; an output circuit direct-coupled path for said device including said anode, said cathode and said first impedance; means for applying a positive unidirectional operating potential to said anode for effecting electron emission from said cathode to establish a space charge of electrons between said grid and cathode; an input circuit direct-coupled path for said device including, in series connection, said grid, said cathode, said first impedance, and a second impedance; and a stabilizing voltage divider network, including said second impedance and a third impedance in series therewith, means for applying a fixed unidirectional operating potential across said second and third impedances, and a direct-coupled connection from said grid to the junction of said second and third impedances, for biasing and maintaining said grid at a fixed unidirectional potential positive with respect to the end of said first impedance remote from said cathode, with said fixed unidirectional potential being of a value which stabilizes the position of said space charge between said grid and cathode to reduce variations in dynamic input capacitance.

3. A high-frequency amplifier circuit according to claim 2, in which each of said impedances consists of a resistance.

4. A high-frequency amplifier circuit comprising; an electron-discharge device having a cathode, a grid and an anode; a first impedance coupled to said cathode; an output circuit direct-coupled path for said device including said anode, said cathode and said first impedance; means for applying a positive unidirectional operating potential to said anode for effecting electron emission from said cathode to establish a space charge of electrons between said grid and cathode; an input circuit direct-coupled path for said device including, in series connection, said grid, said cathode, said first impedance and a second impedance; a stabilizing network including means for applying to and maintaining on said grid a fixed unidirectional operating potential positive with respect to the end of said first impedance remote from said cathode, the fixed unidirectional potential being of a value which stabilizes the position of said space charge between said grid and said cathode to reduce variations in dynamic input capacitance; and a bypass capacitor connected in parallel with said first impedance to prevent substantial degeneration in said amplifier circuit.

5. In a high-frequency amplifier circuit including an electron-discharge device having a cathode, a grid and an anode and which during operation develops a space charge of electrons between said grid and cathode, a circuit for reducing variations in dynamic input capacitance of said device comprising: an impedance having one end connected to said cathode and across which a unidirectional potential is developed by electron flow in said device; a unidirectional fixed potential source; a unidirectional-current-conductive voltage divider direct coupled across said unidirectional fixed potential source and between the positive terminal of said potential source and the other end of said first impedance; and unidirectional-current-conductive direct-coupled means connecting said grid to a point on said voltage divider which applies and maintains a fixed and unidirectional potential on said grid at a value which stabilizes the position of said space charge between said grid and cathode.

References Cited in the file of this patent

UNITED STATES PATENTS

| | | |
|---|---|---|
| 1,816,462 | Baird | July 28, 1931 |
| 2,508,416 | Murakami | May 23, 1950 |
| 2,552,809 | O'Brien | May 15, 1951 |
| 2,603,723 | Thompson | July 15, 1952 |
| 2,655,597 | Scoles | Oct. 13, 1953 |
| 2,762,873 | Goodrich | Sept. 11, 1956 |
| 2,854,606 | Spiegel | Sept. 30, 1958 |

FOREIGN PATENTS

| | | |
|---|---|---|
| 120,878 | Sweden | Dec. 18, 1947 |